United States Patent [19]

Kosai

[11] Patent Number: 4,885,619

[45] Date of Patent: Dec. 5, 1989

[54] HGCDTE MIS DEVICE HAVING A CDTE HETEROJUNCTION

[75] Inventor: Kenneth Kosai, Goleta, Calif.

[73] Assignee: Santa Barbara Research Center, Goleta, Calif.

[21] Appl. No.: 355,064

[22] Filed: May 16, 1989

Related U.S. Application Data

[63] Continuation of Ser. No. 88,330, Aug. 24, 1987, abandoned.

[51] Int. Cl.[4] .................. H01L 29/78; H01L 29/34; H01L 29/04
[52] U.S. Cl. ........................................ 357/24; 357/52; 357/54; 357/60; 357/61
[58] Field of Search ............ 357/16, 24, 24 LR, 24 M, 357/60, 61, 54, 23.15, 52

[56] References Cited

U.S. PATENT DOCUMENTS

| | | | |
|---|---|---|---|
| 4,132,999 | 1/1979 | Maillé et al. | 357/61 |
| 4,357,620 | 11/1982 | Wang et al. | 357/16 |
| 4,377,904 | 3/1983 | Chapman et al. | 357/24 |
| 4,424,525 | 1/1984 | Mimura | 357/55 |
| 4,635,083 | 1/1987 | Cooper, Jr. | 357/16 |
| 4,658,277 | 4/1987 | Schiebel | 357/24 LR |

Primary Examiner—Andrew J. James
Assistant Examiner—Ngan Van Ngo
Attorney, Agent, or Firm—W. C. Schubert; W. K. Denson-Low

[57] ABSTRACT

A MIS semiconductor device comprises a crystalline substrate having a first energy band gap and a crystalline passivation layer overlying a surface of the substrate. The passivation layer is comprised of a semiconductor material having a wider band gap than the semiconductor material of the substrate. In an illustrative embodiment of the invention a MIS semiconductor device comprises a mercury-cadmium-telluride (HgCdTe) substrate having a cadmium-telluride (CdTe) heterojunction formed thereon, the CdTe functioning as a layer of high-quality passivation. A metal gate insulator may be $SiO_2$, low temperature CVD $Si_3N_4$, or any other suitable insulator deposited at a relatively low temperature.

10 Claims, 2 Drawing Sheets

HGCDTE MIS DEVICE HAVING A CDTE HETEROJUNCTION

This application is a continuation of application Ser. No. 088,330, filed Aug. 24, 1987 now abandoned.

FIELD OF THE INVENTION

The present invention relates to semiconductor devices and, in particular, relates to a HgCdTe or InSb MIS device having a CdTe or CdZnTe heterojunction.

BACKGROUND OF THE INVENTION

Metal-insulator-semiconductor (MIS) devices fabricated with mercury-cadmium-telluride (HgCdTe) or indiumantimonide (InSb) typically employ some form of surface passivation and a gate insulator. MIS devices often use a native oxide passivation in conjunction with a ZnS insulator, or a layer of $SiO_2$, the $SiO_2$ serving as both the passivation and insulator. The disadvantages of these HgCdTe and InSb devices include difficulties in controlling surface state densities, hysteresis effects and flat band instabilities which occur when these devices are exposed to moisture and/or ionic contaminants.

Other disadvantages inherent in the use of $SiO_2$ passivation are unreliable mechanical properties such as poor adhesion, a susceptibility to ionic contamination which results in the aforementioned flat band instability, and manufacturing difficulties in the proper preparation of the HgCdTe or InSb surface prior to the deposition of the $SiO_2$.

SUMMARY OF THE INVENTION

The foregoing disadvantages of the prior art are overcome and other advantages are realized by a MIS semiconductor device which, in accordance with the invention, comprises a semiconductor heterojunction wherein a passivation layer is of a wider band gap than an underlying substrate.

In an illustrative embodiment of the invention, a MIS device comprises a mercury-cadmium-telluride (HgCdTe) substrate having a cadmium-telluride (CdTe) heterojunction formed thereon, the CdTe functioning as a layer of high-quality passivation. The gate insulator may be $SiO_2$, low temperature CVD $Si_3N_4$, or any other suitable insulator deposited at a relatively low temperature.

In other embodiments of the invention, MIS devices are comprised of a HgCdTe substrate having a cadmium-zinc-telluride (CdZnTe) passivation layer, or an indiumantimonide (InSb) substrate having a CdTe or CdZnTe passivation layer formed thereon.

The crystalline structure of the passivation layer is lattice-matched to and is crystallographically continuous with the crystalline structure of the substrate. The passivation layer is grown in the same apparatus as the substrate, such as a molecular beam epitaxy MBE or metal-organic chemical vapor deposition (MOCVD) apparatus. The resulting electrical characteristics, such as capacitance and charge transfer efficiency, of the passivation-substrate interface are superior to those of other known types of passivation.

In an illustrative embodiment of the invention, a charge-coupled device (CCD) has a HgCdTe substrate upon which a CdTe passivation epilayer is grown. The low density of the substrate surface interface states which results from the CdTe passivation provides for low electrical noise and a high charge transfer efficiency (CTE). The CTE of such a device is equal to that of a buried channel type of device, while the charge handling capacity is similar to that of a surface mode CCD. The high permittivity of CdTe results in a larger intrinsic capacitance and storage well capacity than of a layer of $SiO_2$ passivation of equal thickness. The CdTe-HgCdTe junction is crystallographically continuous, resulting in a heterojunction that is extremely stable and immune to flat-band shifts due to ionic contaminants. In addition, the CdTe-HgCdTe device of the invention can be photolithographically processed in a manner which is similar to that employed for the MIS devices of the prior art.

BRIEF DESCRIPTION OF THE DRAWINGS

The foregoing aspects and other features of the invention will become apparent in the subsequent description of a preferred embodiment taken in conjunction with the accompanying drawing wherein.

DETAILED DESCRIPTION OF THE INVENTION

Figure 1:
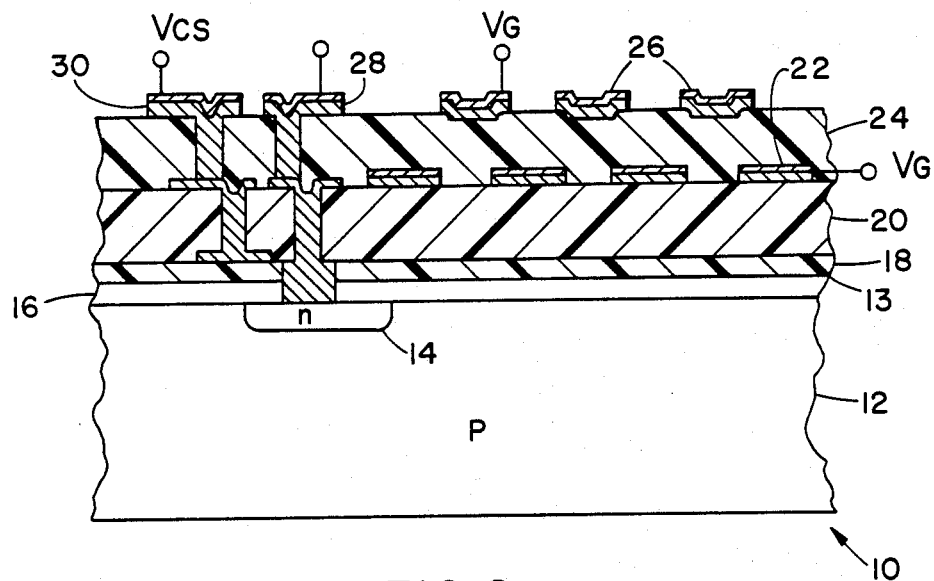
FIG. 1 is a cross-sectional view of a surface mode charge coupled device having an embodiment of the invention.

Although the invention will be described in the context of a CCD semiconductor device, it should be realized that the use of the invention is well suited to the fabrication of a number of semiconductor devices, including field effect transistors (FET) and a variety of image sensing devices. The invention will be described in the context of a CdTe passivation layer formed upon a HgCdTe substrate. It should be realized, however, that the use of the invention is not restricted to these semiconductor materials but may be employed with other semiconductor heterojunctions in which the passivation layer is of a wider bandgap than the substrate. Examples of other materials are CdZnTe passivation on a HgCdTe substrate and a CdTe or CdZnTe passivation on InSb. Referring now to FIG. 1 there is shown in cross-section a portion of a HgCdTe surface mode charge coupled device 10. Device 10 is comprised of a substrate 12 which is formed from a crystalline HgCdTe semiconductor material which is doped with a suitable acceptor impurity, such as arsenic, so that the substrate 12 exhibits the electrical properties of a p-type semiconductor material. Formed within the substrate 12, typically by ion implantation, is an n-type region 14. Region 14 may be formed, in a well known manner, by the implantation of a suitable n-type donor material, such as boron, within an upper surface region 13 of the p-type substrate 12. The interface of the n-type region 14 and the p-type substrate 12 forms a p-n diode junction, the p-type region having holes as majority charge carriers and the n-type region having electrons as the majority charge carriers. Of course, if desired, the substrate may be doped such that it has characteristics of an n-type material and a p-type dopant may be implanted therein.

Overlying the upper surface region 13 of substrate 12 is a passivation layer 16 which, in accordance with the invention, comprises a layer of epitaxial CdTe. A method for forming such a layer and the characteristics of the layer will be described in detail hereinafter.

Overlying the passivation layer 16 is a gate insulator layer 18 which may be comprised of $SiO_2$, $Si_3N_4$ or any other suitable electrical insulator which may be deposited at a relatively low temperature. Overlying the gate insulator layer 18 is a channel stop insulator layer 20. Overlying the layer 20 are a plurality of buried metal gates 22 and an overlying layer of buried metal insulator 24. Layers 20 and 24 are each comprised, typically, of $SiO_2$. Overlying the layer 24 are a plurality of surface metal gates 26. Device 10 also comprises an input/output diode terminal 28 which makes electrical contact with the aforementioned p-n diode junction. The device also comprises a channel stop terminal 30, the channel stop terminal 30 allowing for a suitable potential $V_{cs}$ to be applied to a region adjacent to the substrate 12 whereby a conductive channel formed within the surface region 13 of substrate 12 may be terminated, therefore confining the channel to a desired portion of the device 10.

Such a surface mode CCD device 10 may have a diode current applied through the terminal 28 or the diode current may result from the selective absorption within the substrate 12 of radiation and the resulting creation of charge carriers within the substrate 12. Inasmuch as the metal gates 22 and 26 are each typically operated with a positive voltage potential applied thereto, those charge carriers represented by electrons will be attracted to the upper surface region 13 of the substrate 12. As is known, a CCD device such as the device 10 is operable for laterally translating these electrons, or packets of electrical charge, through the surface region 13. Typically, the gates are sequentially energized by a positive voltage potential $V_G$ such that a packet of charge is caused to move across the surface region 13 under the influence of an overlying energized gate. Thus, charge may be either stored or generated within the device and subsequently detected.

As can be appreciated, inasmuch as the p-n diode junction is formed within the upper surface region 13 and the translation of the charge packets also occurs within this region 13 the electrical characteristics, such as capacitance and charge transfer efficiency of the surface region 13, are an important consideration in the design and fabrication of such devices. One important factor affecting the electrical characteristics of this region 13 is the quality and effectiveness of the layer of passivation 16 which is deposited thereon.

In accordance with the invention, the passivation layer 16 is comprised of an epitaxial layer of CdTe. The CdTe passivation layer 16 is grown, preferably, upon the HgCdTe substrate as a continuation of the same growth process whereby the substrate 12 is grown. This prevents the exposure of the surface region 13 of substrate 12 to atmospheric contaminants and ensures that the CdTe-HgCdTe heterojunction interface is substantially free of impurities which will adversely affect the electrical characteristics of the surface region 13.

One preferred growth method is by molecular beam epitaxy (MBE) which has been found to produce CdTe-HgCdTe superlattices. Another preferred method of growth of the CdTe epitaxial passivation layer is by metal-organic chemical vapor deposition (MOCVD). Of course, other growth methods which are suitable for forming a substrate of HgCdTe and an epitaxial layer of CdTe thereupon may also be utilized to form a semiconductor device in accordance with the invention.

In practice, the HgCdTe crystalline structure of substrate 12 is first grown within the growth apparatus. Thereafter, the crystalline structure of the CdTe passivation layer 16 is grown to a desired thickness upon the surface of the substrate 12. In order to provide for an optimum surface region 13 the substrate 12 is caused to remain in the growth apparatus until the CdTe passivation layer 16 is grown thereon. This ensures that the surface region 13 will not be exposed to atmospheric contaminants or other undesirable chemicals or gases. The diffusion of these undesirable contaminants into the surface region 13 of the substrate 12 before the passivation layer is formed thereon results in undesirable electrical characteristics to be exhibited by the completed device. Thus, by maintaining the substrate 12 within the controlled environment of the growth apparatus until the passivation layer is grown thereupon, this contamination of the surface region 13 is substantially avoided.

The CdTe passivation layer 16 is typically relatively thin and may have a thickness which varies from 500 to 1000 A°. The thinness of the layer 16 allows for the ion implantation of the n-type region 14 directly through the layer 16. Therefore, the surface region 13 need not be exposed to possible contamination during the implantation process. Once the CdTe-HgCdTe layers are grown and the ion implantation is complete, photolithographic processing of the device may be carried out by substantially the same techniques and apparatus as is done for the devices of the prior art.

Based on the foregoing it can be appreciated that the invention provides for a semiconductor device having a very high quality passivation layer which results in the device exhibiting a low interface state density. For a CCD type of semiconductor device this further results in a low level of electrical noise and a high charge transfer efficiency. The use of the invention also results in very low noise, high-transconductance field effect transistors (FET's) and in CCD's which exhibit the low noise and charge transfer efficiency of a buried channel type of device while also having the storage well capacity of a surface mode type of device. Other advantages realized by the use of the invention include the following.

The processes for the deposition of the gate, channel stop and buried metal insulators may each be separately optimized for mechanical properties, such as strength and adhesion, without regard for the electrical quality of the interface with the underlying semiconductor since the electrical charge carriers are confined to the CdTe-HgCdTe interface by the low conductance of the CdTe passivation layer 16.

Also, the crystalline structure of the CdTe passivation layer 16 makes this layer substantially impervious to the diffusion of ionic contaminants therethrough. This results in the improved stability of flat band and FET threshold voltages, and in a lower hysteresis of capacitance-voltage characteristics. Any ionic contaminants which may be inadvertently included in an overlying insulator layer, such as the channel stop insulator 20, will diffuse no further than the insulator's interface with the CdTe passivation layer 16. Since these contaminants do not diffuse into the surface region 13, a resulting improvement in flat band and threshold voltages is realized.

The capacitance of the CdTe-insulator composite structure is al so higher than that of an equal thickness of insulator, such as $SiO_2$. This is due to the higher intrinsic permittivity of the CdTe passivation layer 16.

This results in, for example, CCD's which exhibit large charge storage capacity at operating voltages that are equivalent to the voltages utilized with devices of the prior art. Thus, a larger charge storage capacity may be realized without a corresponding increase in device operating power.

Furthermore, a semiconductor device fabricated in accordance with the invention may be a buried channel heterojunction CCD having a high storage well capacity. Normally, such devices are limited in storage capacity by the requirement that the gate insulator be isolated from charge. This is due to the tendency of the gate insulator to trap charge therein and cause a charge transfer loss. However, the high quality of the interface provided by the CdTe results in a CCD which exhibits a higher charge handling capacity.

Figure 2:
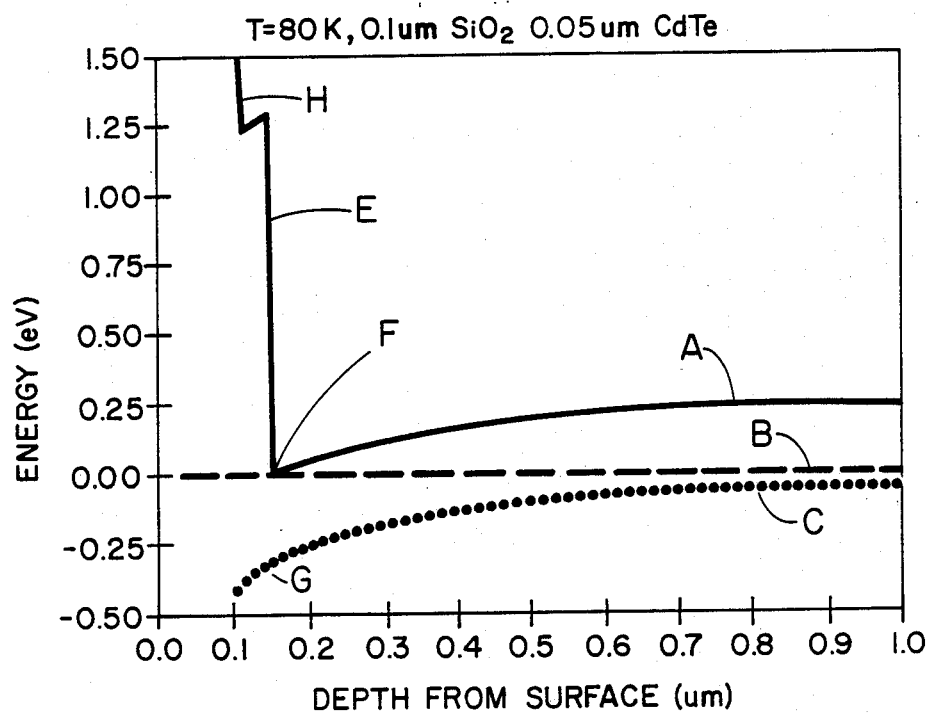
FIG. 2 is a graph showing the energy band diagram of a heterojunction capacitor having a zero gate bias applied thereto.

Referring now to FIG. 2 there is shown a graph which illustrates the energy band diagram for a capacitor formed by a 1000 A° thick layer of $SiO_2$ overlying a 500 A° thick CdTe epilayer formed upon the surface of a HgCdTe base layer. FIG. 2 shows the electron energy in electron volts along the ordinate and the depth from the surface of the heterojunction along the abscissa. The curve labeled A shows the conduction band energy $E_c$, the curve labeled B shows the valence energy $E_v$ and the curve labeled C shows the Fermi energy $E_{Fn}$. The portion of the graph curve above the point H illustrates the relatively large band energies in the $SiO_2$ gate insulator, these energies being too large to plot at the scale of FIG. 2. At G the Fermi band energy abruptly decreases and at H the conduction band energy abruptly increases. Both of these abrupt transitions at G and H are due to the $SiO_2$. As can be seen, in that portion of the curve labelled E there is a sharp drop in the conduction band energy which is due to the relative doping levels in the CdTe and HgCdTe, as well as to the detailed physics of band alignment in the CdTe-HgCdTe heterojunction. This sharp change (E) in the conduction band energy results in the free electrons within the surface region of the HgCdTe base layer being confined to the surface of the base layer and, hence, not being free to enter the CdTe epilayer. That portion of the curve labelled F shows the conduction band energy within the inversion layer channel which is located within the upper surface region of the HgCdTe base layer. As can be seen, as the depth into the base layer is increased the electron energy associated with the inversion layer channel gradually rises. This inversion layer located at the CdTe-HgCdTe interface forms the conduction channel for CCD and FET devices.

Figure 3:
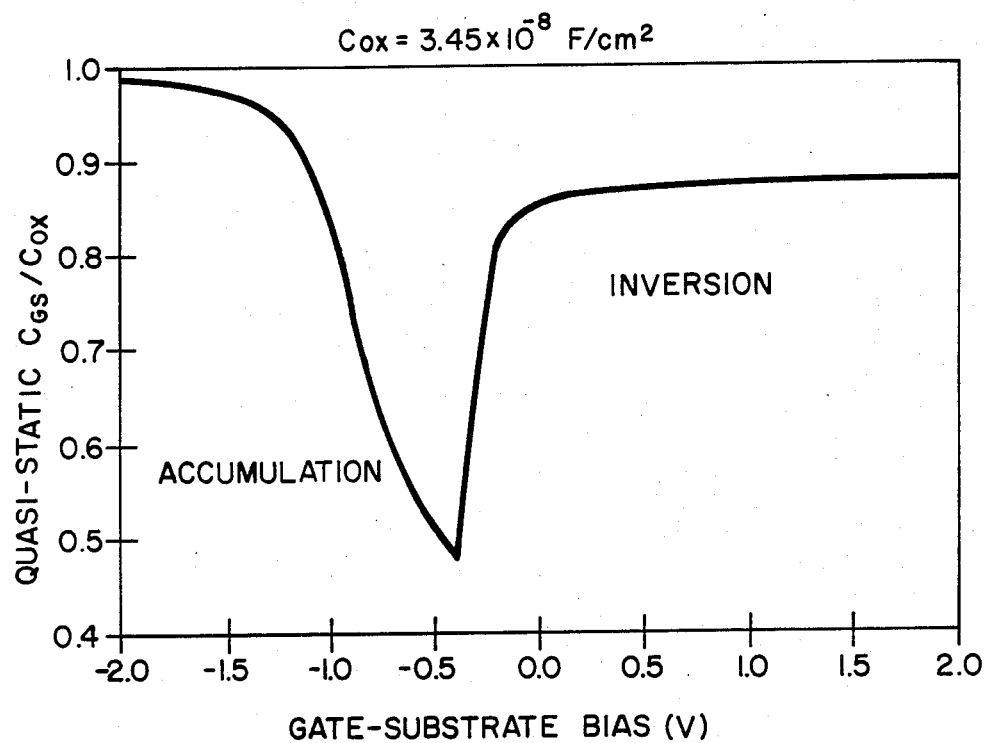
FIG. 3 is a graph showing the quasi-static capacitance-voltage characteristic of the heterojunction capacitor of FIG. 2.

Referring now to FIG. 3, there is shown the quasi-static capacitance-voltage characteristic for the capacitor having the energy band diagram shown in FIG. 2. The capacitance is normalized to that of the $SiO_2$ layer, which is approximately $3.45 \times 10^{-8}$ F/cm$^2$. The capacitance is similar to that for a MIS capacitor which does not have a CdTe passivation layer except that the inversion capacitance resulting from a positive gate bias potential is smaller in magnitude than the accumulation capacitance due to a negative gate bias while in a MIS capacitor not having the CdTe passivation layer the quasi-static capacitance in inversion is substantially equal to that in accumulation. This is due to the charge carriers represented as holes, which tend to accumulate at the $SiO_2$-CdTe interface, forming a "capacitor" whose "plates" are separated only by the $SiO_2$ layer. However, in inversion the electrons form a capacitor whose plates are separated by a dielectric which consists of the $SiO_2$ layer and also the CdTe layer.

Although a specific embodiment of the invention has herein been described, it will be appreciated that other embodiments of the invention may be made within the spirit and scope of the invention. Accordingly, it is intended that the foregoing disclosure and the showing made in the drawings shall be considered only as illustrations of the principles of this invention, and are not to be construed in a limiting sense. The invention is, instead, intended to be limited only by the appended claims.

What is claimed is:

1. A metal-insulated-semiconductor device comprising:
    a substrate comprised of semiconductor material having a first crystalline structure and further having a first type of electrical conductivity;
    a layer of passivation overlying at least one surface of said substrate, said passivation layer being comprised of an epitaxial layer of Group II-VI material having a second crystalline structure which is substantially crystallographically continuous and substantially lattice matched with said first crystalline structure, an energy bandgap of said passivation layer being wider than an energy bandgap of said substrate;
    at least one region having a second type of electrical conductivity disposed within a surface region of said substrate for forming a p-n diode junction, said region having the second type of electrical conductivity being disposed at least partly beneath said passivation layer;
    a first layer of electrical insulator material overlying said passivation layer;
    a first plurality of spaced apart gate electrodes disposed upon said first electrical insulator layer;
    a second layer of electrical insulator material overlying said first layer of electrical insulator material and said first plurality of gate electrodes; and
    a second plurality of spaced apart gate electrodes disposed upon a top surface of said second electrical insulator layer.

2. A semiconductor device as defined in claim 1 wherein said substrate is comprised of mercury-cadmium-telluride and wherein said passivation layer comprises cadmium-telluride or cadmium-zinc telluride.

3. A semiconductor device as defined in claim 1 wherein said substrate is comprised of indium-antimonide and wherein said passivation layer comprises cadmium-telluride or cadmium-zinc-telluride.

4. A surface mode charge coupled semiconductor device comprising:
    a substrate comprised of material having a first crystalline structure, said substrate being doped with a first type of inpurity atom for providing said substrate with a first given type of charge carriers;
    a region formed within a surface of said substrate, said region being doped with a second type of impurity atom for providing said region with a second given type of charge carriers, the interface of said region and said substrate forming a diode junction within said substrate;
    a passivation layer overlying said surface of said substrate, said passivation layer being comprised of an epitaxial layer of Group II-VI material having a wider energy bandgap than an energy bandgap of said substrate, said passivation layer having a second crystalline structure which is substantially lattice matched with said first crystalline structure;

a gate insulator overlying said passivation layer;

a channel stop insulator layer overlying said gate insulator layer;

a plurality of buried metal gate electrodes disposed in a spaced-apart manner upon a top surface of said channel stop insulator layer;

a buried metal insulator layer overlying said channel stop insulator layer and said buried metal gate electrodes;

a plurality of surface metal gate electrodes disposed in a spaced-apart manner upon a top surface of said buried metal insulator layer;

an input/output diode terminal disposed through each of said layers and being electrically coupled to said region for electrically coupling to said diode; and a channel stop terminal disposed through said buried metal insulator layer and said channel stop insulator, said channel stop terminal being operable for having a voltage potential coupled thereto for terminating a charge carrier conduction channel within said surface of said substrate.

5. A semiconductor device as defined in claim 4 wherein said substrate is comprised of mercury-cadmium-telluride and wherein said passivation layer comprises cadmium-telluride or cadmium-zinc-telluride.

6. A semiconductor device as defined in claim 4 wherein said substrate is comprised of indium-antimonide and wherein said passivation layer comprises cadmium-telluride or cadmium-zinc-telluride.

7. A semiconductor device as defined in claim 4 wherein said first given type of charge carriers are holes and wherein said second given type of charge carriers are electrons.

8. The semiconductor device as defined in claim 4 wherein said passivation layer has a thickness of approximately 500 to approximately 1000 angstroms.

9. A metal-insulator-semiconductor device comprising:

a crystalline semiconductor substrate comprised of Group II-VI material and having a first type of electrical conductivity;

at least one region disposed within a top surface of said substrate, said region having an opposite type of electrical conductivity for defining a diode junction;

a first layer of electrical insulator material disposed over said first substrate, said electrical insulator material layer having a first plurality of gate electrodes disposed upon a top surface of said first layer;

a second layer of electrical insulator material overlying said first layer of electrical insulator material and said first plurality of gate electrodes;

a second plurality of gate electrodes disposed upon a top surface of said second layer of electrical insulating material; and a passivation layer interposed between said first layer of electrical insulator material and said substrate, said passivation layer being comprised of an epitaxial layer of Group II-VI material which is substantially lattice matched to the Group II-VI material of said substrate, the Group II-VI material of said passivation layer further having a wider energy bandgap than the Group II-VI material of said substrate.

10. A semiconductor device as defined in claim 9 wherein said passivation layer has a thickness of approximately 500 to approximately 1000 angstroms.

* * * * *